(12) United States Patent
Meisenzahl

(10) Patent No.: US 8,350,952 B2
(45) Date of Patent: Jan. 8, 2013

(54) IMAGE SENSORS WITH IMPROVED ANGLE RESPONSE

(75) Inventor: Eric J. Meisenzahl, Ontario, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 583 days.

(21) Appl. No.: 12/132,652

(22) Filed: Jun. 4, 2008

(65) Prior Publication Data

US 2009/0303377 A1 Dec. 10, 2009

(51) Int. Cl.
- H04N 5/225 (2006.01)
- H04N 5/335 (2011.01)
- H04N 3/12 (2006.01)
- H01L 31/232 (2006.01)
- H01L 27/146 (2006.01)

(52) U.S. Cl. ........ 348/340; 348/315; 348/309; 348/294; 348/332; 257/432; 257/435

(58) Field of Classification Search .................. 348/340, 348/315, 319, 309, 332, 294; 257/222, 233, 257/440

See application file for complete search history.

(56) References Cited

U.S. PATENT DOCUMENTS

| | | | |
|---|---|---|---|
| 2,446,791 A | 8/1948 | Schroeder | |
| 2,508,267 A | 5/1950 | Kasperowicz | |
| 2,884,483 A | 4/1959 | Ehrenhaft et al. | |
| 3,725,572 A | 4/1973 | Kurokawa et al. | |
| 4,047,203 A | 9/1977 | Dillon | |
| 4,121,244 A | 10/1978 | Nakabe et al. | |
| 4,390,895 A | 6/1983 | Sato et al. | |
| 4,663,661 A | 5/1987 | Weldy | |
| 4,823,186 A | 4/1989 | Muramatsu | |
| 4,962,419 A | 10/1990 | Hibbard et al. | |
| 5,018,006 A | 5/1991 | Hashimoto | |
| 5,164,831 A | 11/1992 | Kuchta et al. | |
| 5,374,956 A | 12/1994 | D'Luna | |
| 5,514,888 A * | 5/1996 | Sano et al. ................ | 257/232 |
| 5,629,734 A | 5/1997 | Hamilton, Jr. et al. | |
| 5,631,703 A | 5/1997 | Hamilton et al. | |
| 5,652,621 A | 7/1997 | Adams, Jr. et al. | |

(Continued)

FOREIGN PATENT DOCUMENTS

CN 101312204 11/2008

(Continued)

OTHER PUBLICATIONS

Eric J. Meisenzahl et al., "10 Mp APS Format Color Full-Frame CCD Image Sensor", Proceedings of ICIS. International Congress of Imaging Science; 20060507, May 2006, pp. 152-154, XP009094707.

(Continued)

*Primary Examiner* — Chieh M Fan
*Assistant Examiner* — Quang Le
(74) *Attorney, Agent, or Firm* — Blakely Sokoloff Taylor & Zafman LLP

(57) ABSTRACT

An image sensor includes a substrate having a plurality of photosensitive areas, a light shield positioned spanning the photosensitive areas in which light shield a plurality of apertures are formed, and a plurality of microlens each disposed centered on one of the apertures such that a focal point of the incident light through each microlens is substantially extended into the substrate to a point where a portion of the incident light directed onto the periphery of each microlens is blocked by a light shield.

14 Claims, 14 Drawing Sheets

U.S. PATENT DOCUMENTS

| | | | |
|---|---|---|---|
| 5,949,914 | A | 9/1999 | Yuen |
| 6,001,668 | A | 12/1999 | Anagnostopoulos et al. |
| 6,002,145 | A | 12/1999 | Niisoe |
| 6,112,031 | A | 8/2000 | Stephenson |
| 6,243,133 | B1 | 6/2001 | Spaulding et al. |
| 6,351,288 | B1 * | 2/2002 | Johnson et al. ............... 348/373 |
| 6,476,865 | B1 | 11/2002 | Gindele et al. |
| 6,686,960 | B2 | 2/2004 | Iizuka |
| 6,903,391 | B2 * | 6/2005 | Takeuchi et al. ............... 257/233 |
| 7,769,241 | B2 | 8/2010 | Adams et al. |
| 7,830,430 | B2 | 11/2010 | Adams, Jr. et al. |
| 8,017,426 | B2 | 9/2011 | Brady |
| 8,068,153 | B2 | 11/2011 | Kumar et al. |
| 8,111,307 | B2 | 2/2012 | Deever et al. |
| 8,119,435 | B2 | 2/2012 | Brady |
| 2002/0003581 | A1 | 1/2002 | Sato et al. |
| 2002/0075391 | A1 | 6/2002 | Shizukuishi |
| 2004/0021155 | A1 | 2/2004 | Harada |
| 2004/0046881 | A1 | 3/2004 | Utagawa |
| 2004/0075667 | A1 | 4/2004 | Burky et al. |
| 2004/0094784 | A1 | 5/2004 | Rhodes et al. |
| 2004/0141659 | A1 | 7/2004 | Zhang |
| 2005/0110002 | A1 | 5/2005 | Noda |
| 2005/0221541 | A1 | 10/2005 | Metzler et al. |
| 2005/0276475 | A1 | 12/2005 | Sawada |
| 2006/0028554 | A1 | 2/2006 | Usui |
| 2006/0033129 | A1 | 2/2006 | Mouli |
| 2006/0043438 | A1 | 3/2006 | Holm et al. |
| 2006/0114340 | A1 | 6/2006 | Sakurai |
| 2006/0269158 | A1 | 11/2006 | O'Hara et al. |
| 2007/0024740 | A1 * | 2/2007 | Strong ............... 348/360 |
| 2007/0047807 | A1 | 3/2007 | Okada |
| 2007/0138588 | A1 | 6/2007 | Wilson et al. |
| 2007/0296051 | A1 | 12/2007 | Meisenzahl |
| 2008/0166062 | A1 | 7/2008 | Adams et al. |
| 2008/0297634 | A1 | 12/2008 | Uya |
| 2009/0057801 | A1 | 3/2009 | Goushcha et al. |
| 2009/0121306 | A1 | 5/2009 | Ishikawa |
| 2009/0121307 | A1 | 5/2009 | Tennant |
| 2010/0006908 | A1 | 1/2010 | Brady |
| 2010/0253833 | A1 | 10/2010 | Deever et al. |
| 2011/0115957 | A1 | 5/2011 | Brady et al. |
| 2011/0211109 | A1 | 9/2011 | Compton et al. |

FOREIGN PATENT DOCUMENTS

| | | |
|---|---|---|
| EP | 0119862 | 9/1984 |
| EP | 0472299 | 2/1992 |
| EP | 0 843 363 A1 | 5/1998 |
| EP | 1 517 374 A2 | 3/2005 |
| EP | 1 557 886 A2 | 7/2005 |
| EP | 1641045 | 3/2006 |
| EP | 19955783 | 11/2008 |
| GB | 2105143 | 3/1983 |
| WO | WO-2006082186 | 8/2006 |
| WO | WO-2007015765 | 2/2007 |

OTHER PUBLICATIONS

International Search Report mailed Jun. 24, 2010, for International Application No. PCT/US201000892.
Written Opinion mailed Sep. 27, 2011, for International Application No. PCT/US201000892.
International Search Report mailed Aug. 10, 2010, for International Application No. PCT/US201001054.
Written Opinion mailed Oct. 18, 2011, for International Application No. PCT/US201001054.
International Search Report mailed Aug. 13, 2010, for International Application No. PCT/US201001352.
Written Opinion mailed Nov. 29, 2011, for International Application No. PCT/US201001352.
International Search Report mailed Nov. 30, 2010, for International Application No. PCT/US201001514.
Written Opinion mailed Dec. 6, 2011, for International Application No. PCT/US201001514.
International Search Report mailed Nov. 5, 2010, for International Application No. PCT/US201001813.
Written Opinion mailed Jan. 4, 2012, for International Application No. PCT/US201001813.
International Search Report mailed Oct. 13, 2010, for International Application No. PCT/US201001679.
Written Opinion mailed Jan. 4, 2012, for International Application No. PCT/US201001679.
International Search Report mailed Jan. 26, 2010, for International Application No. PCT/US200808323.
Written Opinion mailed Sep. 30, 2008, for International Application No. PCT/US200808323.
International Search Report mailed Sep. 30, 2009, for International Application No. PCT/US200903334.
Written Opinion mailed Dec. 6, 2010, for International Application No. PCT/US200903334.
International Search Report mailed Sep. 20, 2010, for International Application No. PCT/US1001556.
Written Opinion mailed Nov. 29, 2011, for International Application No. PCT/US1001556.
International Search Report dated Oct. 12, 2009 for International Application No. PCT/US2009/003974 filed Jul. 7, 2009.
Written Opinion dated Jan. 11, 2011 for International Application No. PCT/US2009/003974 filed Jul. 7, 2009.
International Search Report dated Sep. 30, 2009 for International Application No. PCT/US2009/003794 filed Jun. 25, 2009.
Written Opinion dated Jan. 11, 2011 for International Application No. PCT/US2009/003794 filed Jun. 25, 2009.
Non-final office action dated Mar. 23, 2010 for U.S. Appl. No. 12/169,723, filed Jul. 9, 2008.
Final office action dated Jul. 26, 2010 for U.S. Appl. No. 12/169,723, filed Jul. 9, 2008.
Non-final office action dated May 18, 2012 for U.S. Appl. No. 13/012,843, filed Jan. 25, 2011.
International Search Report dated Apr. 29, 2010 for International Application No. PCT/US2010/000521 filed Feb. 23, 2010.
Written Opinion dated Sep. 13, 2011 for International Application No. PCT/US2010/000521 filed Feb. 23, 2010.
Non-final office action dated Feb. 27, 2012 for U.S. Appl. No. 12/401,002, filed Mar. 10, 2009.
International Search Report dated Aug. 10, 2010 for International Application No. PCT/US2010/001640 filed Jun. 7, 2010.
Written Opinion dated Dec. 12, 2011 for International Application No. PCT/US2010/001640 filed Jun. 7, 2010.
Non-final office action dated Aug. 18, 2011 for U.S. Appl. No. 12/480,820, filed Jun. 9, 2009.
International Search Report dated Oct. 7, 2010 for International Application No. PCT/US2010/001725 filed Jun. 16, 2010.
Written Opinion dated Jan. 4, 2012 for International Application No. PCT/US2010/001725 filed Jun. 16, 2010.
International Search Report dated Sep. 3, 2010 for International Application No. PCT/US2010/001678 filed Jun. 11, 2010.
Written Opinion dated Jan. 4, 2012 for International Application No. PCT/US2010/001678 filed Jun. 11, 2010.
European Application No. 08780001.7-1241; First Office Action dated May 22, 2012.
Chinese Patent Application No. 200880025408.7, filed Jul. 7, 2008; Second Office Action dated Mar. 29, 2012.

* cited by examiner

IMAGE SENSORS WITH IMPROVED ANGLE RESPONSE

FIELD OF THE INVENTION

The present invention generally relates to image sensors having microlenses and, more particularly, to such image sensors having microlenses that focuses incident light deep into the substrate and whose effect is to maintain sensitivity at large incident light angles.

BACKGROUND OF THE INVENTION

Referring to FIGS. 1 and 2, image sensor 10 includes a substrate 15 in which there is an array of pixels 20, and each pixel 30 is photosensitive. Referring now only to FIG. 2, depending on the architecture of the pixel 30, some regions of the pixel 30 may be intentionally shielded from light to improve optical isolation between adjacent pixels 30. In some cases, the light is inadvertently blocked as a result of the types of materials used to operate the pixel 30, such as control lines. For example, in interline CCD and CMOS image sensor pixels 30 dedicate a portion of the pixel area for reading out an image while another portion integrates the next image. This type of pixel requires the readout region to be shielded from light.

In all these cases, the pixel 30 will contain a light shield 40 that restricts where light is permitted to enter the pixel 30. However, this is undesired as it reduces the amount of light that can be sensed by the pixel 30 which reduces the overall sensitivity of the image sensor 10 and ultimately the sensitivity of camera in which it is included. The ratio of light sensitive area to pixel area is commonly referred to as the optical fill factor, and the area where the light shield 40 does not reside is referred to as the pixel aperture 50. Pixel apertures 50 are typically equally spaced to maintain uniform image sampling.

To overcome the loss in sensitivity due to the light shield 40, it has become common to incorporate a microlens 60 over each pixel 30, and the microlenses 60 are centered on the aperture 50. Light that may have otherwise been blocked or reflected by the light shield 40 is redirected by the microlens 60 through the aperture 50 and sensed by the pixel 30 thereby increasing sensitivity. Referring to FIG. 3, it is noted that there is a special case of full-frame or frame transfer type CCD image sensors 10 where the pixel 30 senses light through two different types optical materials, one of which is more transparent than the other. For example, a polysilicon material 70 will transmit less light than an indium tin oxide (ITO) material 80.

Referring to FIG. 4, in this case, a microlens 60 and a modified light shield 40 may be used to direct the light through the more transparent material, ITO 80, resulting in an overall gain in sensitivity. For color image sensors, redirecting all of the light through only one material type has the added benefit of reducing hue shifts across the array. This effect is most evident when the incident light angle varies across the array and is due to variations of each material's spectral (wavelength) response.

Referring to FIG. 5, although the presently known image sensor 10 is satisfactory, when incident light intersects the microlens 60 at an angle (θ), such as is common when introducing a camera lens, the focal point shifts away from the center of the aperture 50.

Referring to FIG. 6, if the incident light ray angle is sufficiently large, the focal point shifts far enough from the center of the aperture 50 to cause a fraction of the light to be blocked by the light shield 40 resulting in absorption or reflection losses. Thus, large and possibly abrupt reductions in sensitivity will be seen, primarily at the edges of the pixel array 20 (see FIG. 1) where the light angles are greatest. Referring to FIG. 7, the dependence of sensitivity with respect to incident light angle is commonly referred to as the array's 'Angle Response.'

Referring to FIG. 8, to overcome this problem and extend the angle response, one practice is to gradually vary the position of the microlens 60 relative to the center of the aperture 50. In this practice, the microlens 60 is centered on the aperture 50 for pixels 30 located at the center of the array 20 (see FIG. 1), and pixel locations away from the center of the array 20 have microlenses 60 that are shifted on the aperture opening 50 toward the center of the array 20. The farther from center that a pixel 30 resides, the more the offset. The total offset is determined based on the characteristics of the camera lens used. Thus, this method works best in the case of a fixed lens system but the extent of the angle response improvement is still limited.

In the application of shift and tilt (view) cameras used in medium and large format photography, the incident light angles can be much larger (greater than 40 degrees) than can be accommodated by an offset microlens configuration. In addition, the light does not always intersect the sensor 10 in the conventional manner. For instance, the incident light angle at every pixel location could be in a single direction for one camera shot and just the opposite in the next. This environment requires the microlens to always be positioned centered on the light shield aperture in order to accommodate all possible camera shots.

SUMMARY OF THE INVENTION

It is an object of the present invention to have microlenses that are centered on the aperture and that can accommodate large angles of the incoming incident light.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the advantage of balancing sensitivity of pixels when high angles of incident light are required.

BRIEF DESCRIPTIONS OF THE DRAWINGS

PREFERRED EMBODIMENT OF THE PRESENT INVENTION

Figure 1:
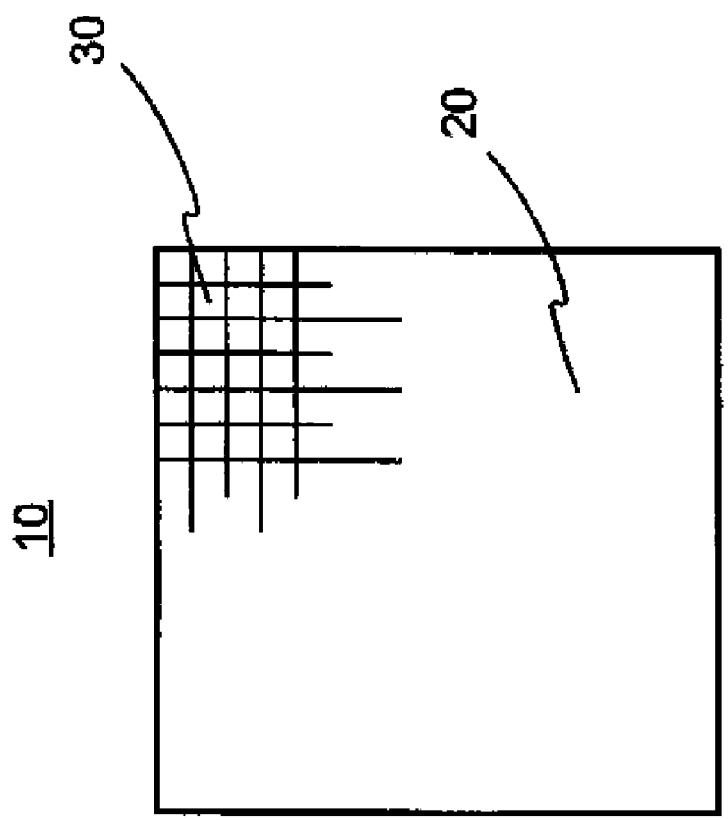
FIG. 1 is a top view of a prior art image sensor.
Figure 2:
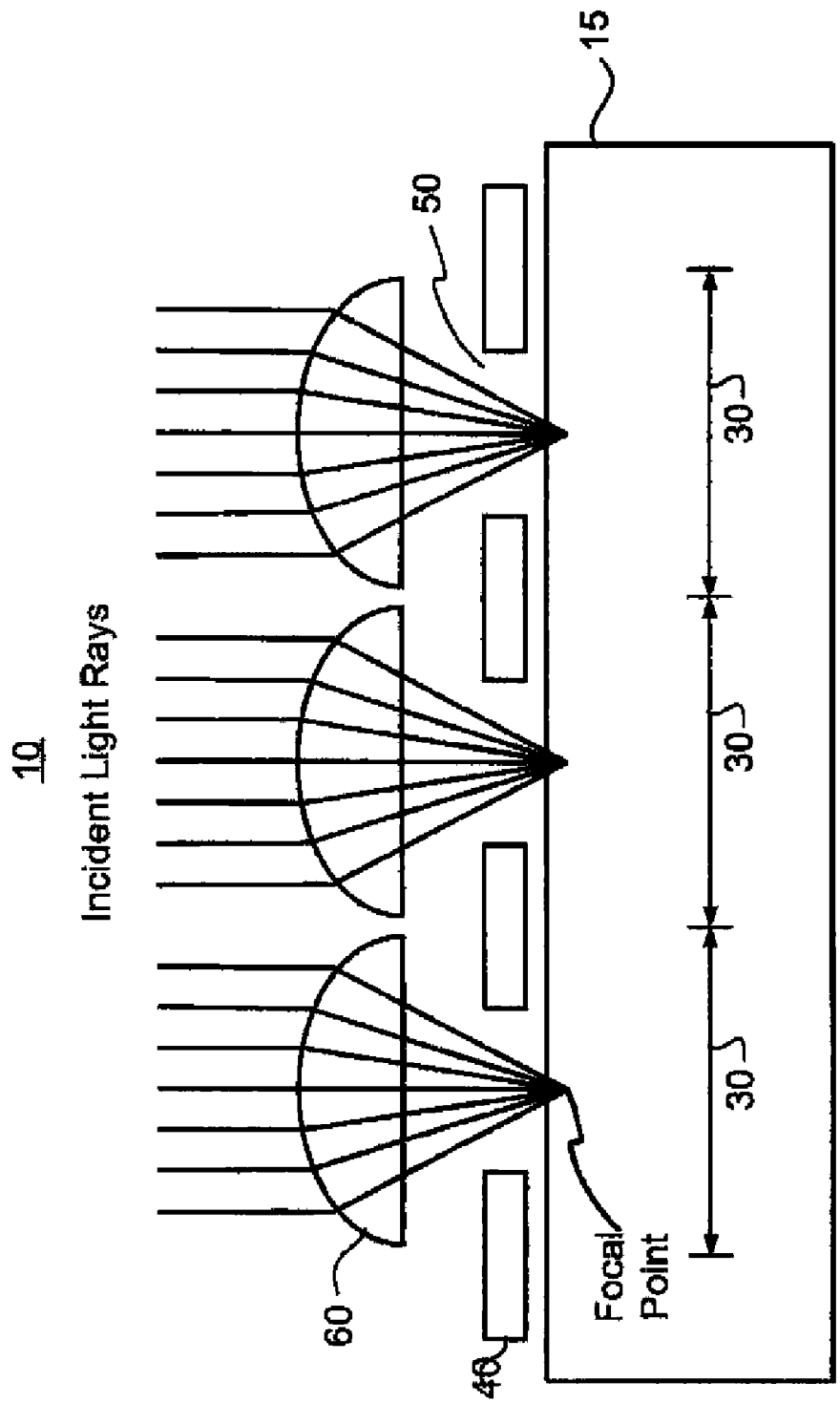
FIG. 2 is a side view of a prior art image sensor illustrating the application of light shield and microlenses.
Figure 3:
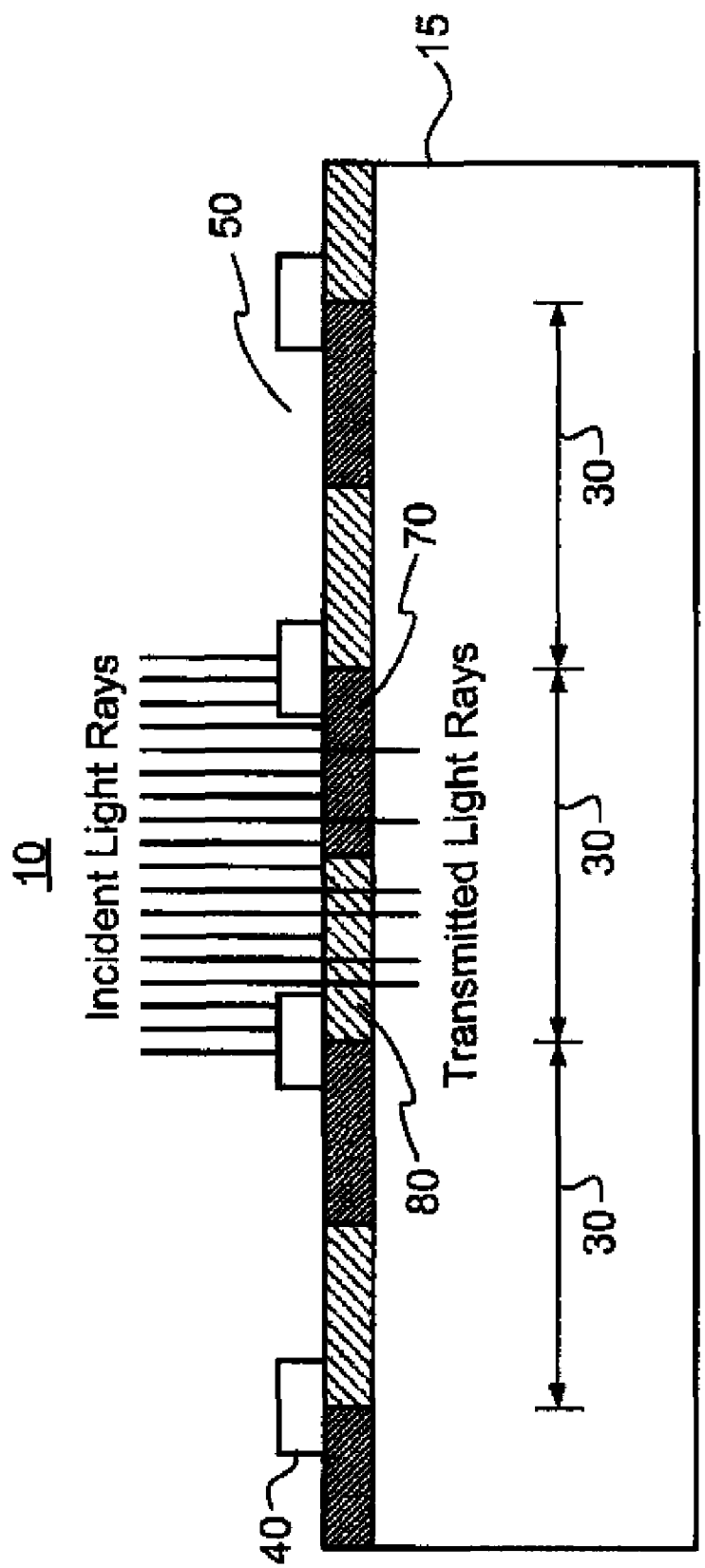
FIG. 3 is a side view of a prior art image sensor illustrating the application of two materials having different optical transmission characteristics (transparent layer)
Figure 4:
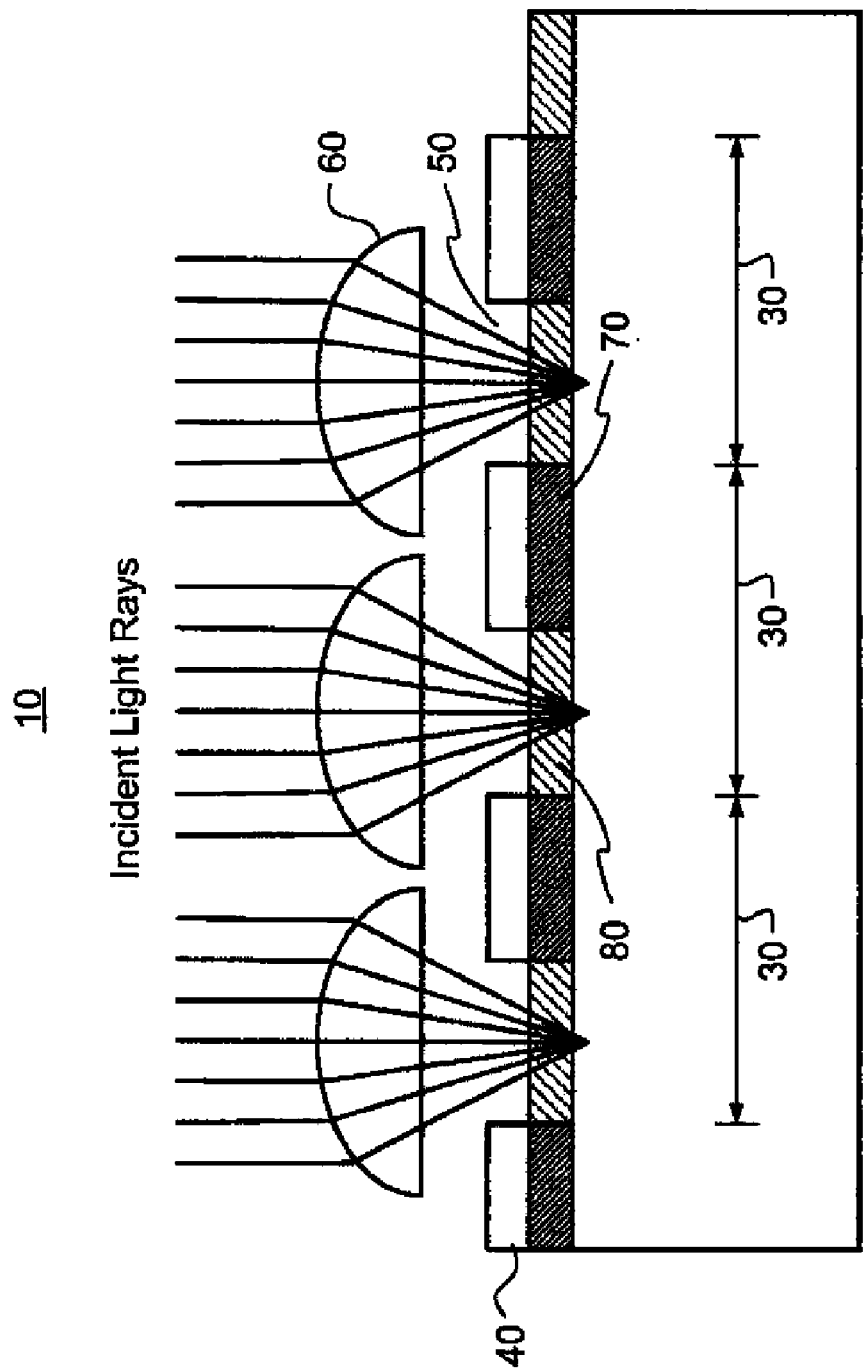
FIG. 4 is a side view of a prior art image sensor illustrating the application of microlenses, light shields and the transparent layer.
Figure 5:
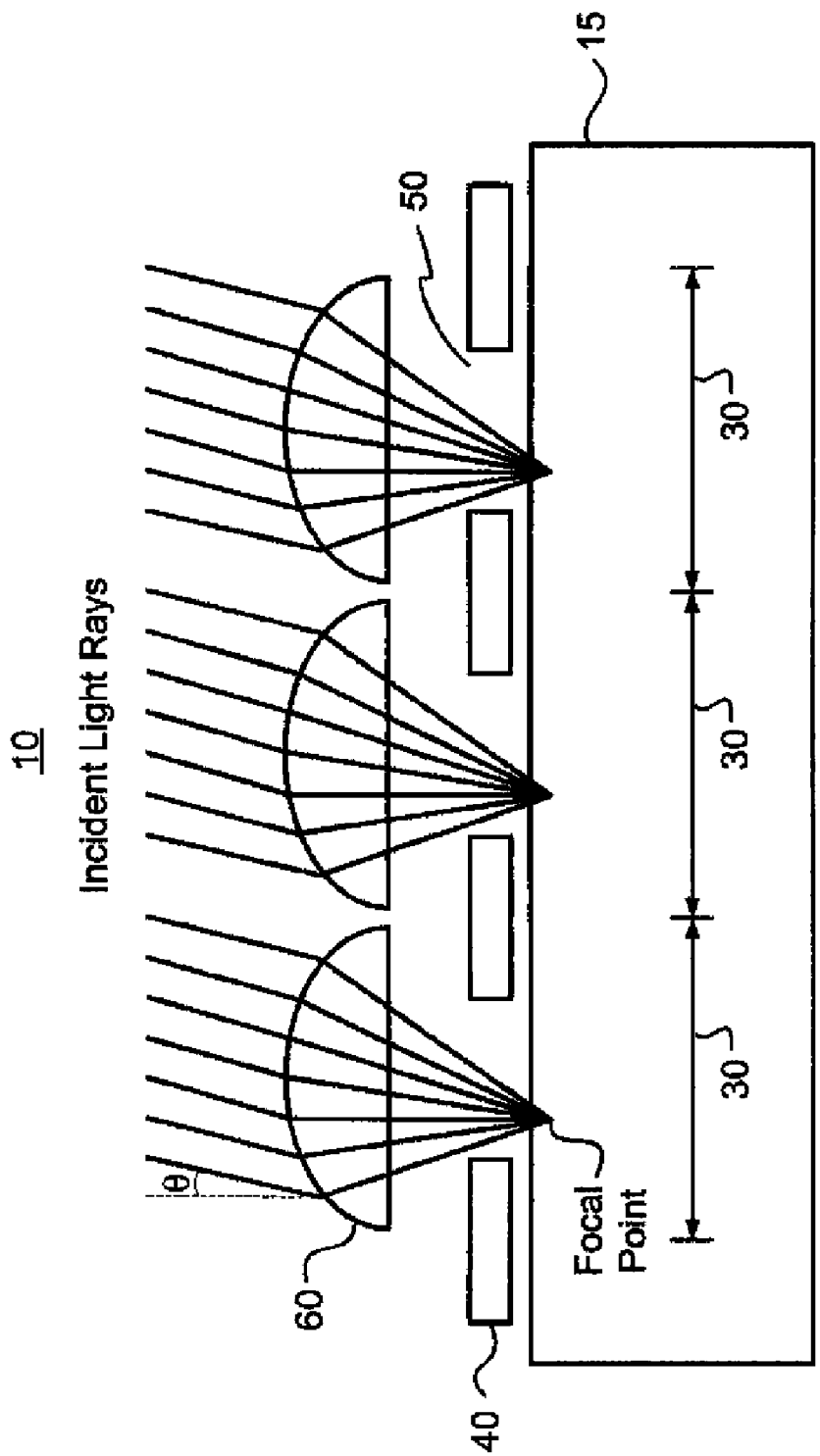
FIG. 5 is a side view of a prior art image sensor illustrating the effect of incident angles of the incoming light.
Figure 6:
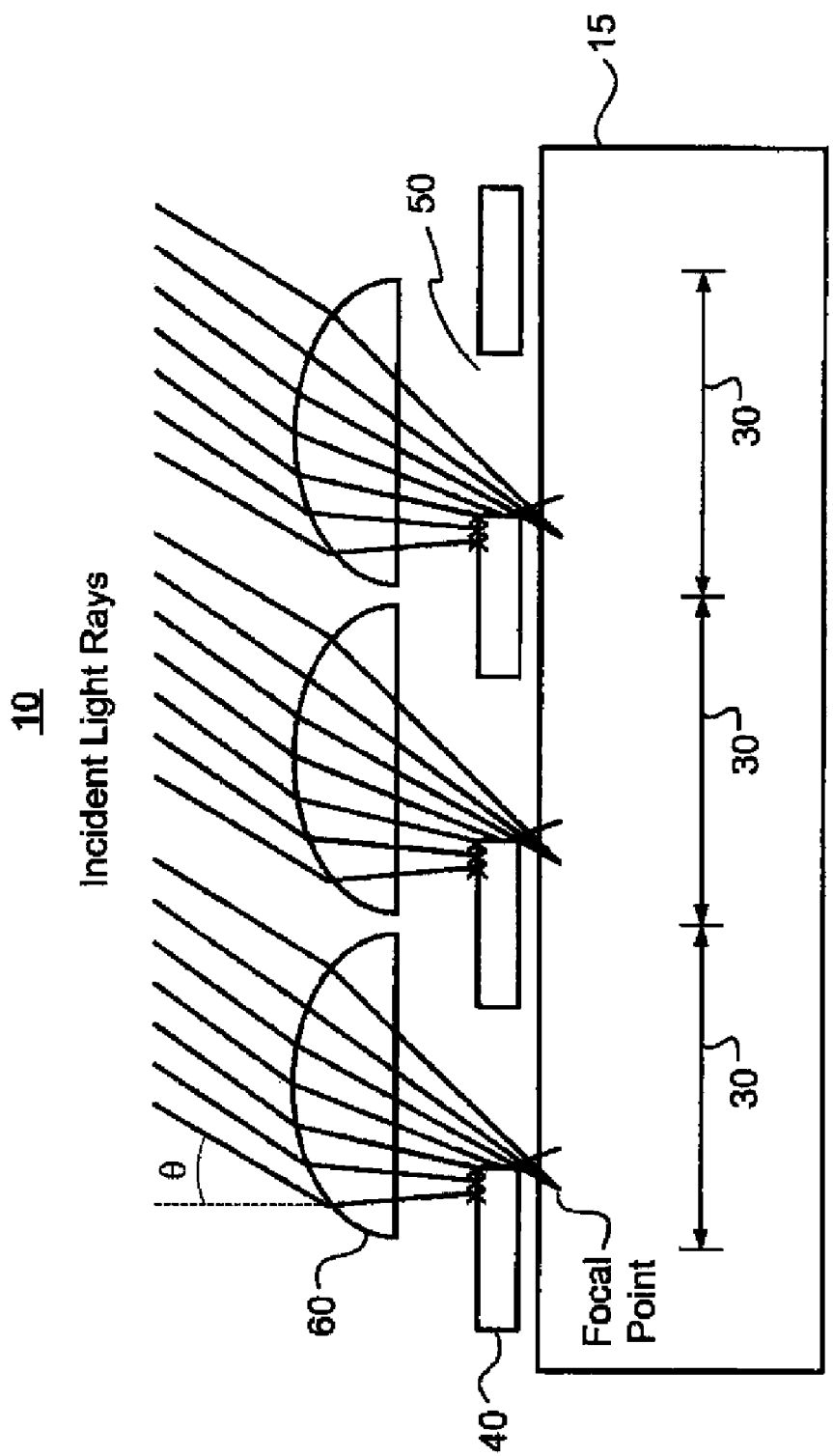
FIG. 6 is a side view of a prior art image sensor illustrating the effect of high incident angles of the incoming light.
Figure 7:
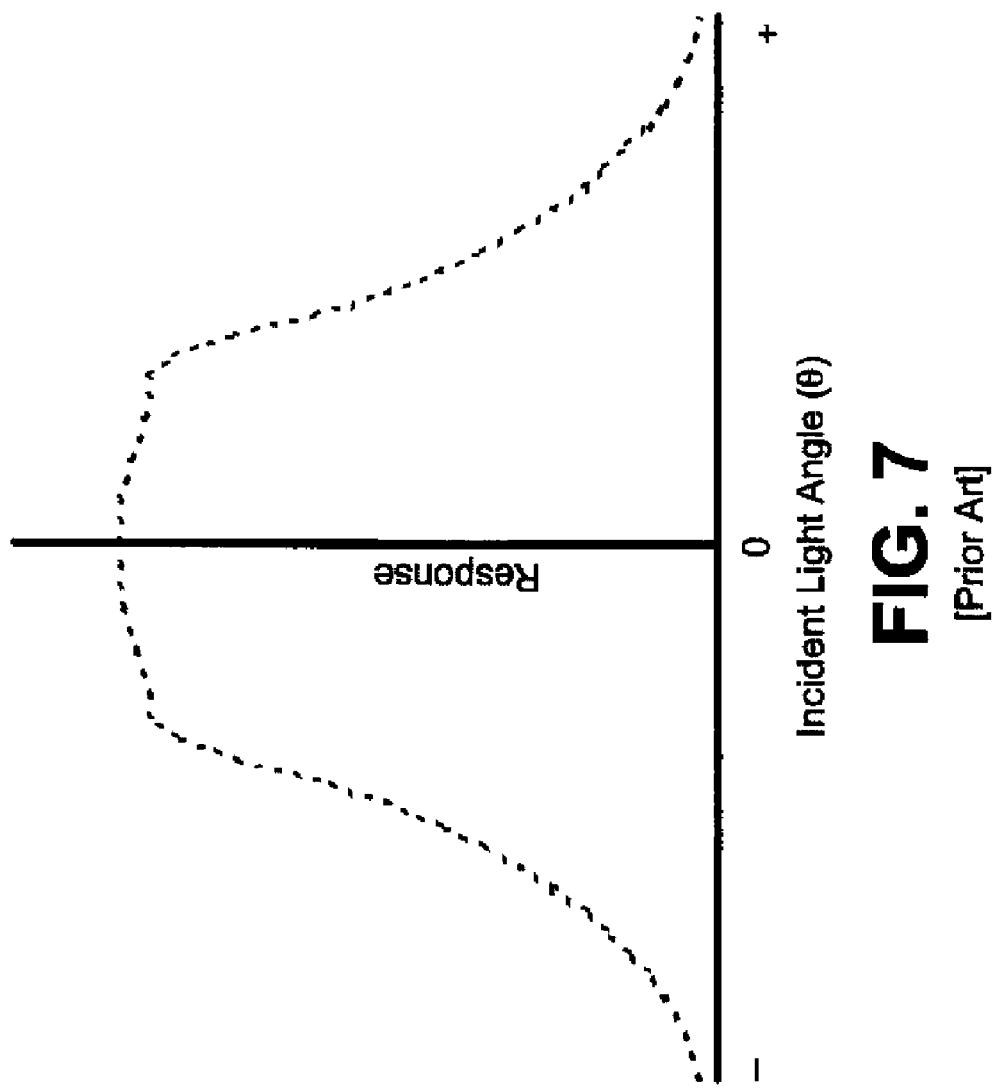
FIG. 7 is a graph illustrating response versus incident light angle.
Figure 8:
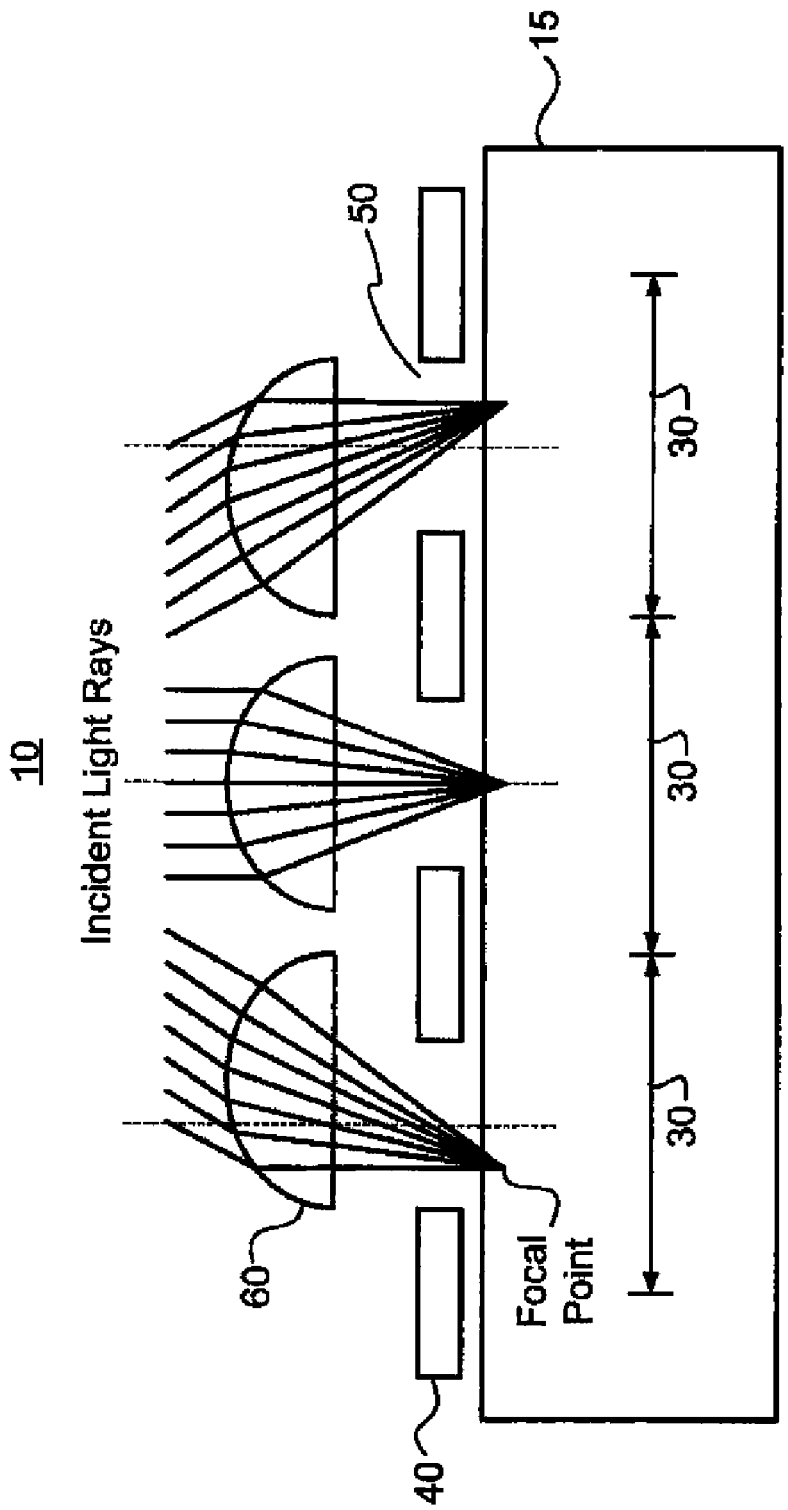
FIG. 8 is a prior art image sensor illustrating the application of varying the position of microlenses.
Figure 9:
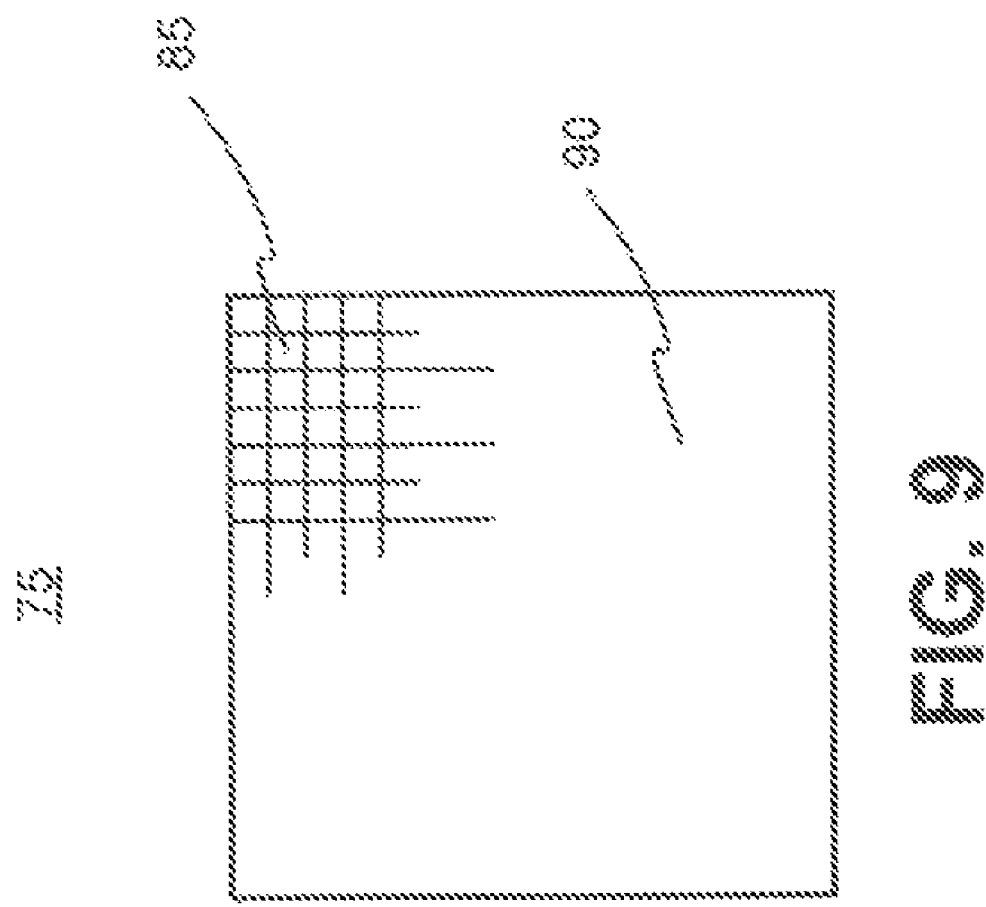
FIG. 9 is a top view of the image sensor of the present invention.
Figure 10:
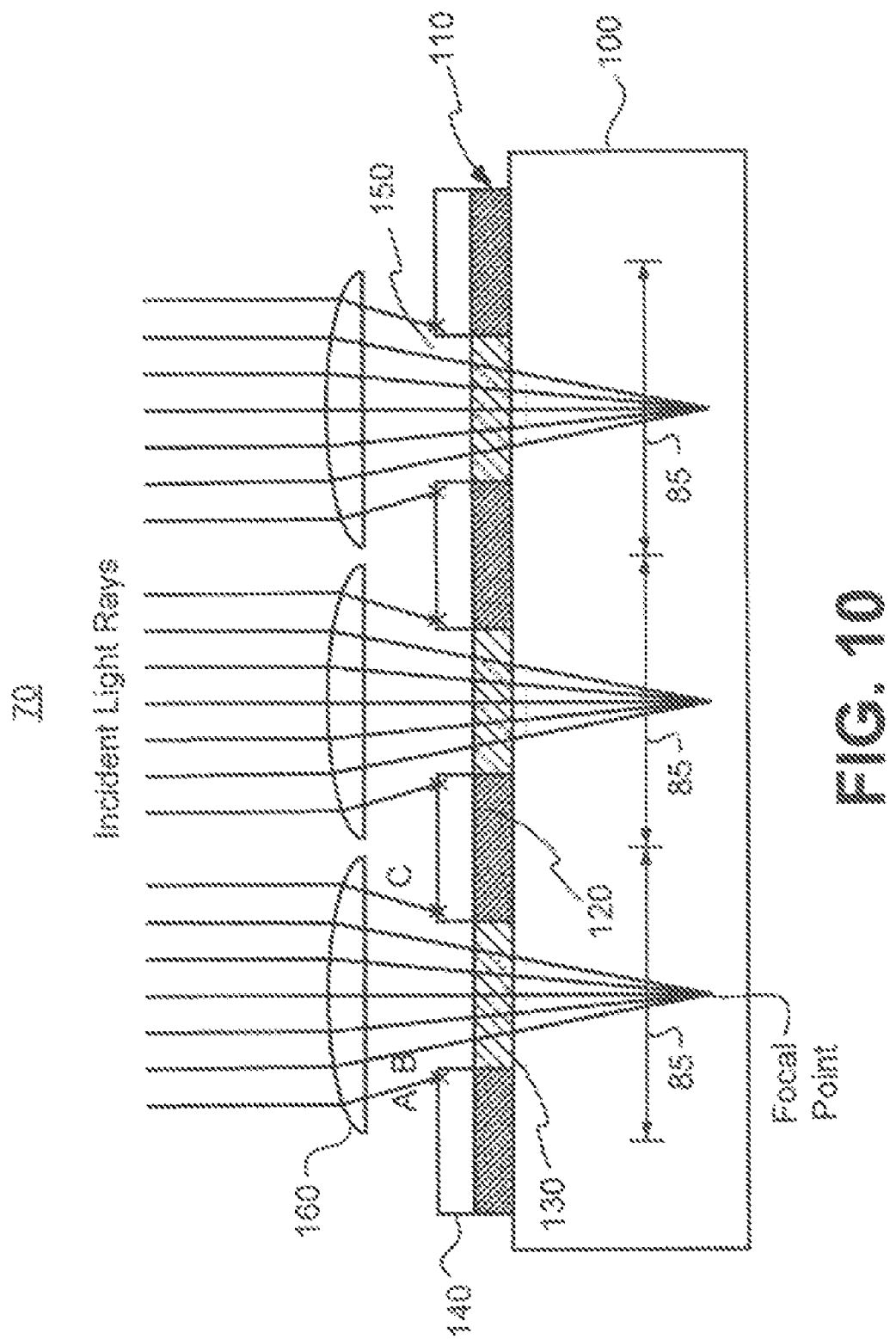
FIG. 10 is a side view of the image sensor of the present invention.

Referring to FIG. 9, there is shown the image sensor 75 of the present invention having a plurality of pixels 85 arranged in a two-dimensional pixel array 90, although a one-dimensional array may also be used. The image sensor 70 is typically either a full-frame charge-coupled device or a frame transfer charge-coupled device. Referring to FIG. 10, the image sensor 70 of the present invention includes a substrate 100 in which is positioned the plurality of pixels 85. It is noted that the substrate 100 may consist of one type doping (either n type or p type), or it may consist of one doping type with varying concentrations, or more than one doping type in which there is a combination of n type and p type. A transparent layer 110 spans and is positioned on the substrate and includes a polysilicon portion 120 and an ITO portion 130, which is more transparent than the polysilicon portion 120. A light shield 140, which includes a plurality of apertures 150 therethrough, is disposed on the transparent layer 110 with an aperture 150 aligned with an ITO portion 130 and the polysilicon portion 120 aligned with the light shield 140. A plurality of microlenses 160 spans the image sensor 70, and one microlens 160 is positioned spanning and centered over each pixel for focusing the light through the aperture 150, the ITO portion 130 and into each pixel. With the microlens 160, light is redirected away from the less transparent polysilicon portion 120 into the more transparent portion 130, and results in improved sensitivity.

It is noted that the microlenses 160 are shaped (with a reduction in the lens' curvature) such that the focal point of the incident light is deep into the substrate 100 to the point where some sensitivity is intentionally lost, even at normal incident light angles. Therefore, at normal incident angles, the size of the cone of light fully fills the aperture opening 150. In other words, each microlens 160 is disposed centered on one of the apertures 150 such that a focal point of the incident light through each microlens 160 is substantially extended into the substrate 100 to a point where a portion of the incident light directed onto the periphery of each microlens 160 is blocked by a light shield 140.

Figure 11:
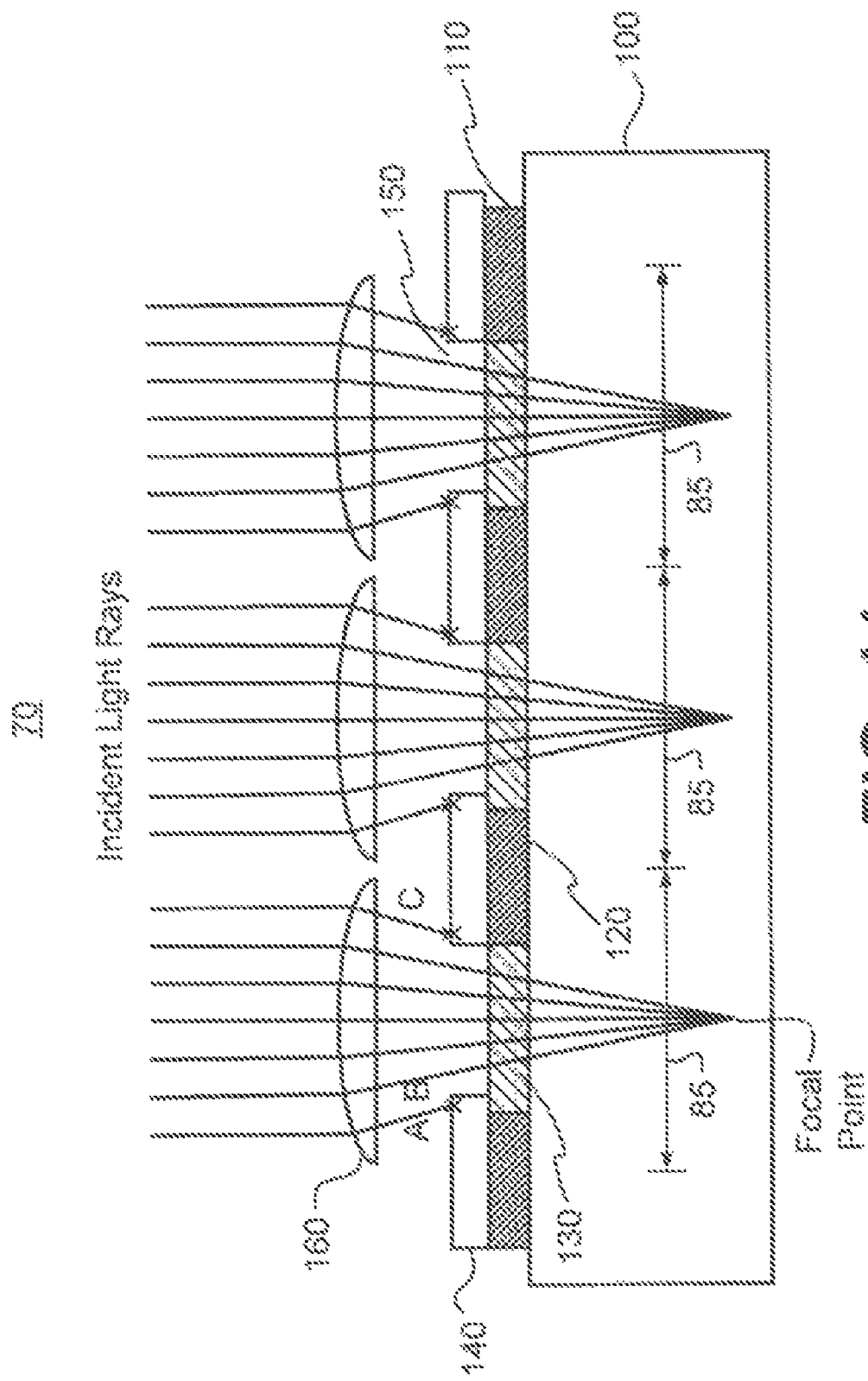
FIG. 11 is a side view of an alternative embodiment of the present invention.

It is instructive to note that, in one embodiment, the light shield 140 completely covers or substantially covers the polysilicon 120, and the ITO 130 is completely exposed. Referring to FIG. 11, in another embodiment, the light shield spans a portion of the ITO 130 and completely spans the polysilicon 120.

Figure 12:
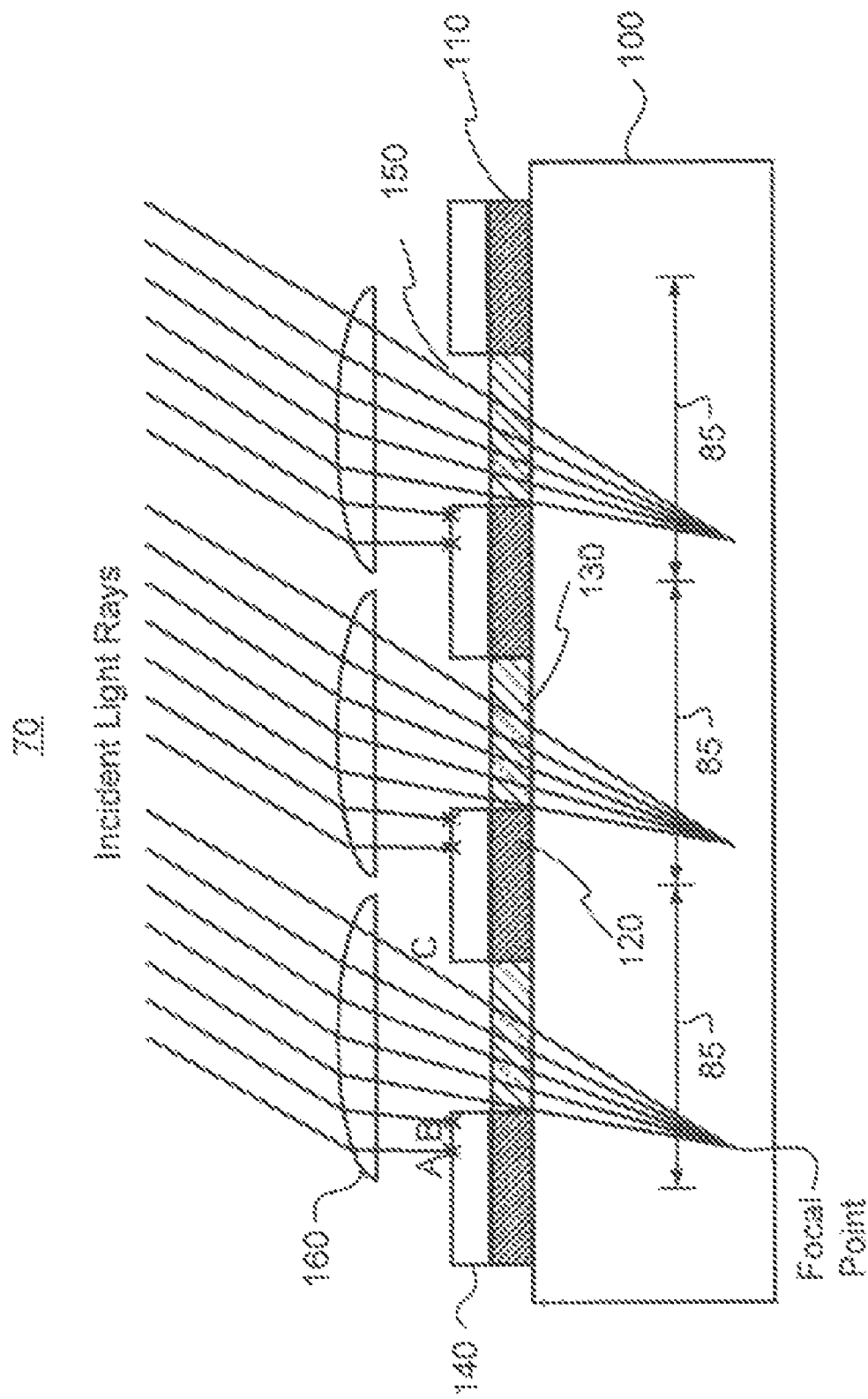
FIG. 12 is a side view of the image sensor of the present invention illustrating the effect of high incident angles.

Referring to FIGS. 10, 11, and 12, as the incident light angle increases, the amount of additional light lost at one edge of the light shield 140 is offset by an increase in light from the opposite edge. The net result is that increased angle response is achieved at the expense of some sensitivity loss, but not as much loss as if no microlens was present except at extreme angles. Another preferable effect is that the sensitivity loss with angle is more gradual and less objectionable than the conventional microlens.

Figure 13:
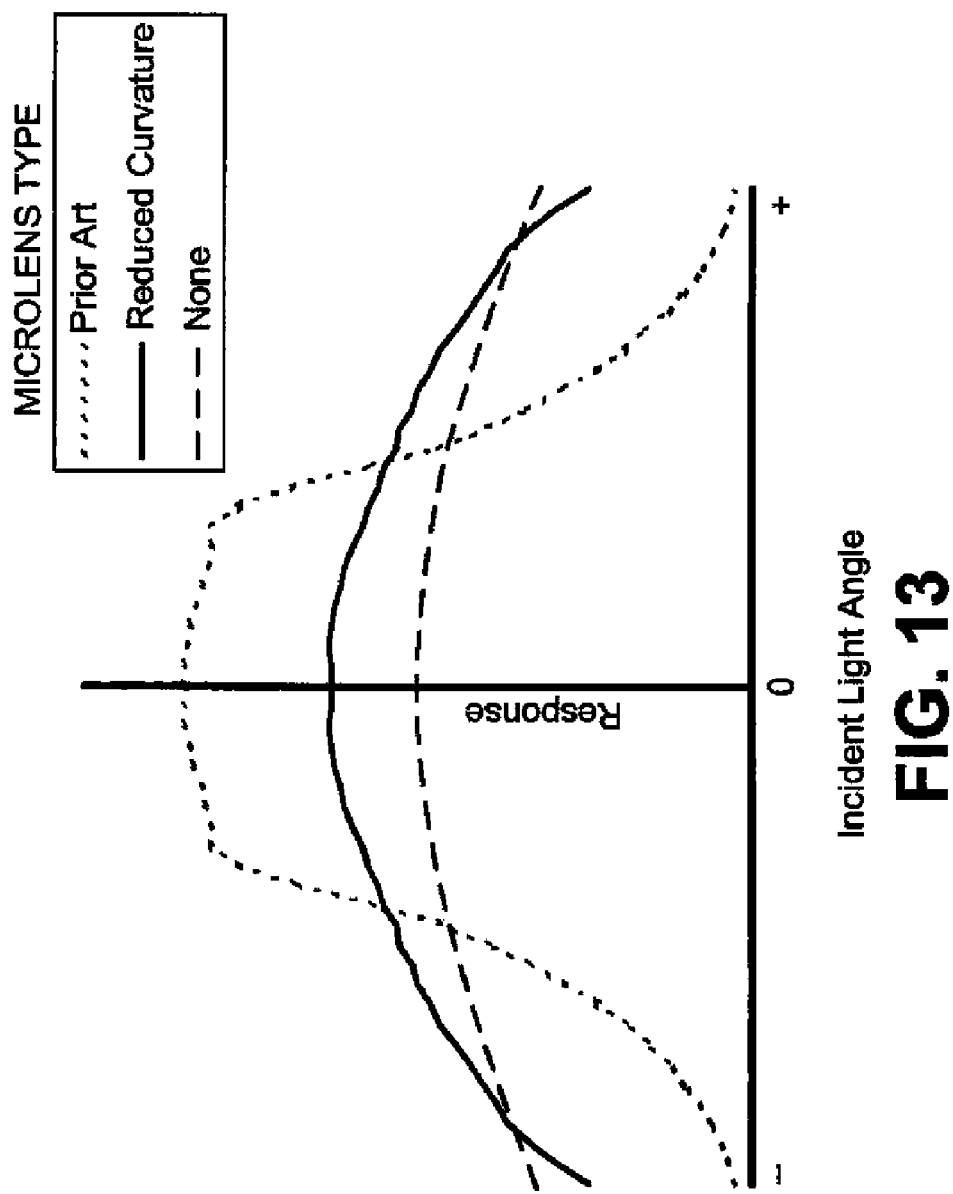
FIG. 13 is graph illustrating response versus incident light angle.

Referring to FIG. 13, there is shown a graph illustrating response versus incident light angle for a sensor of the present invention.

Figure 14:
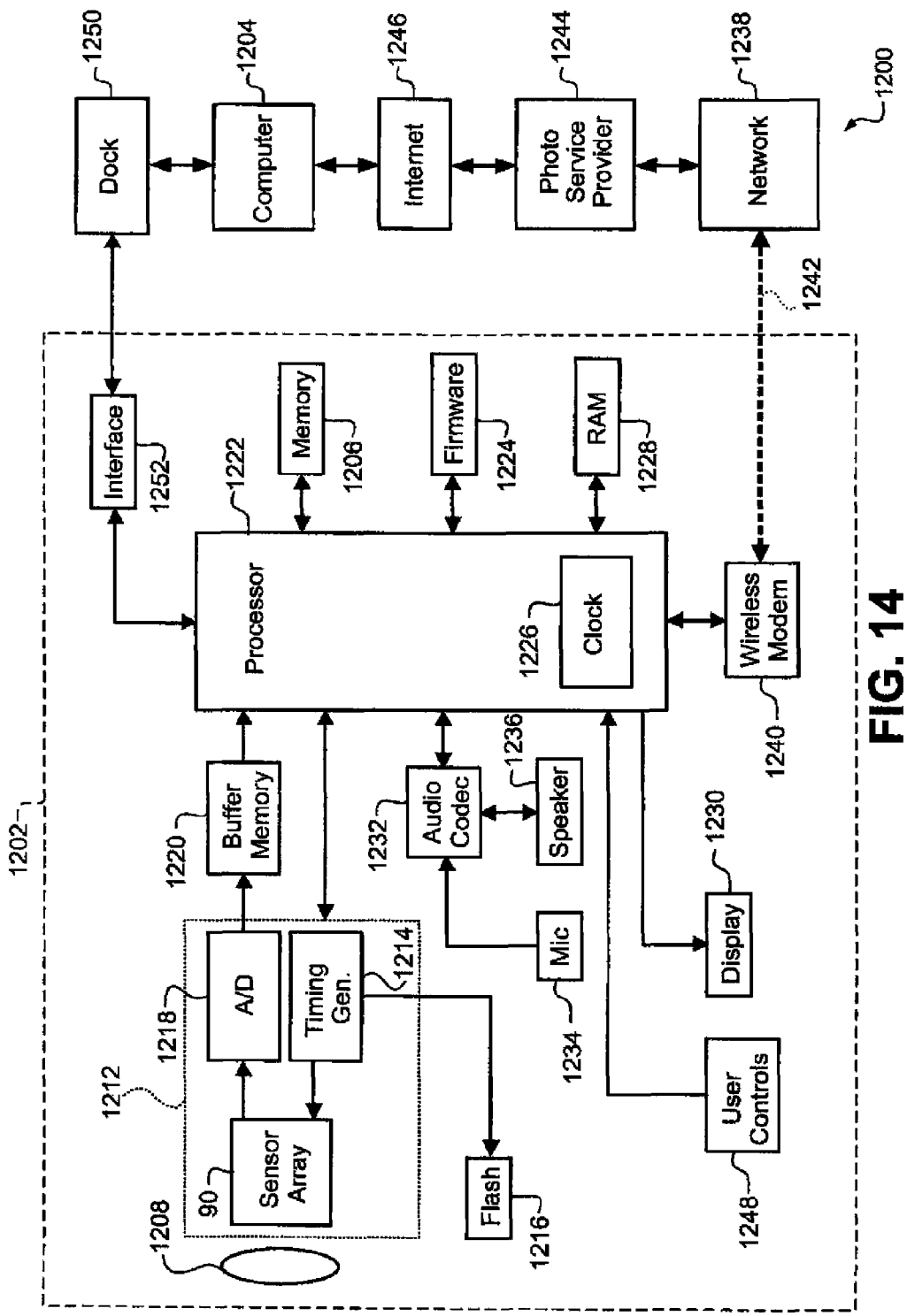
FIG. 14 is an imaging system using the image sensor of the present invention.

Referring to FIG. 14, there is shown a block diagram of an imaging system that can be used with the image sensor 70 in accordance with the present invention. Imaging system 1200 includes digital camera phone 1202 and computing device 1204. Digital camera phone 1202 is an example of an image capture device that can use an image sensor incorporating the present invention. Other types of image capture devices can also be used with the present invention, such as, for example, digital still cameras and digital video camcorders.

Digital camera phone 1202 is a portable, handheld, battery-operated device in an embodiment in accordance with the invention. Digital camera phone 1202 produces digital images that are stored in memory 1206, which can be, for example, an internal Flash EPROM memory or a removable memory card. Other types of digital image storage media, such as magnetic hard drives, magnetic tape, or optical disks, can alternatively be used to implement memory 1206.

Digital camera phone 1202 uses optical lens 1208 to focus light from a scene (not shown) onto the pixel array 90 of pixel sensor 1212. The optical lens 1208 may be shifted and tilted relative to the image sensor 70. Pixel array 90 provides color image information using the Bayer color filter pattern in an embodiment in accordance with the invention. Pixel array 90 is controlled by timing generator 1214, which also controls flash 1216 in order to illuminate the scene when the ambient illumination is low.

The analog output signals output from the pixel array 90 are amplified and converted to digital data by analog-to-digital (A/D) converter circuit 1218. The digital data are stored in buffer memory 1220 and subsequently processed by digital processor 1222. Digital processor 1222 is controlled by the firmware stored in firmware memory 1224, which can be flash EPROM memory. Digital processor 1222 includes real-time clock 1226, which keeps the date and time even when digital camera phone 1202 and digital processor 1222 are in a low power state. The processed digital image files are stored in memory 1206. Memory 1206 can also store other types of data, such as, for example, music files (e.g. MP3 files), ring tones, phone numbers, calendars, and to-do lists.

In one embodiment in accordance with the invention, digital camera phone 1202 captures still images. Digital processor 1222 performs color interpolation followed by color and tone correction, in order to produce rendered sRGB image data. The rendered sRGB image data are then compressed and stored as an image file in memory 1206. By way of example only, the image data can be compressed pursuant to the JPEG format, which uses the known "Exif" image format. This format includes an Exif application segment that stores particular image metadata using various TIFF tags. Separate TIFF tags can be used, for example, to store the date and time the picture was captured, the lens f/number and other camera settings, and to store image captions.

Digital processor 1222 produces different image sizes that are selected by the user in an embodiment in accordance with the invention. One such size is the low-resolution "thumbnail" size image. Generating thumbnail-size images is described in commonly assigned U.S. Pat. No. 5,164,831, entitled "Electronic Still Camera Providing Multi-Format Storage of Full and Reduced Resolution Images" to Kuchta, et al. The thumbnail image is stored in RAM memory 1228 and supplied to color display 1230, which can be, for example, an active matrix LCD or organic light emitting diode (OLED). Generating thumbnail size images allows the captured images to be reviewed quickly on color display 1230.

In another embodiment in accordance with the invention, digital camera phone 1202 also produces and stores video clips. A video clip is produced by summing multiple pixels of image sensor array 10 together (e.g. summing pixels of the same color within each 4 column×4 row area of the image sensor array 10 to create a lower resolution video image frame. The video image frames are read from pixel array 90 at regular intervals, for example, using a 15 frame per second readout rate).

Audio codec 1232 is connected to digital processor 1222 and receives an audio signal from microphone (Mic) 1234. Audio codec 1232 also provides an audio signal to speaker 1236. These components are used both for telephone conversations and to record and playback an audio track, along with a video sequence or still image.

Speaker 1236 is also used to inform the user of an incoming phone call in an embodiment in accordance with the invention. This can be done using a standard ring tone stored in firmware memory 1224, or by using a custom ring-tone downloaded from mobile phone network 1238 and stored in memory 1206. In addition, a vibration device (not shown) can be used to provide a silent (e.g. non-audible) notification of an incoming phone call.

Digital processor 1222 is connected to wireless modem 1240, which enables digital camera phone 1202 to transmit and receive information via radio frequency (RF) channel 1242. Wireless modem 1240 communicates with mobile phone network 1238 using another RF link (not shown), such as a 3GSM network. Mobile phone network 1238 communicates with photo service provider 1244, which stores digital images uploaded from digital camera phone 1202. Other devices, including computing device 1204, access these images via the Internet 1246. Mobile phone network 1238 also connects to a standard telephone network (not shown) in order to provide normal telephone service in an embodiment in accordance with the invention.

A graphical user interface (not shown) is displayed on color display 1230 and controlled by user controls 1248. User controls 1248 include dedicated push buttons (e.g. a telephone keypad) to dial a phone number, a control to set the mode (e.g. "phone" mode, "calendar" mode" "camera" mode), a joystick controller that includes 4-way control (up, down, left, right) and a push-button center "OK" or "select" switch, in embodiments in accordance with the invention.

Dock 1250 recharges the batteries (not shown) in digital camera phone 1202. Dock 1250 connects digital camera phone 1202 to computing device 1204 via dock interface 1252. Flock interface 1252 is implemented as wired interface, such as a USB interface, in an embodiment in accordance with the invention. Alternatively, in other embodiments in accordance with the invention, dock interface 1252 is implemented as a wireless interface, such as a Bluetooth or an IEEE 802.11b wireless interface. Dock interface 1252 is used to download images from memory 1206 to computing device 1204. Dock interface 1252 is also used to transfer calendar information from computing device 1204 to memory 1206 in digital camera phone 1202.

The invention has been described with reference to a preferred embodiment. However, it will be appreciated that variations and modifications can be effected by a person of ordinary skill in the art without departing from the scope of the invention.

PARTS LIST 10 image sensor (prior art)
15 substrate (prior art)
20 pixel array (prior art)
30 plurality of pixels (prior art)
40 light shield (prior art)
50 pixel aperture (prior art)
60 microlenses (prior art)
70 polysilicon material
75 image sensor
80 indium tin oxide (ITO) material
85 plurality of pixels
90 pixel array
100 substrate
110 transparent layer
120 polysilicon
130 ITO
140 light shield
150 aperture
160 microlenses
1200 imaging system
1202 digital camera phone
1204 computing device
1206 memory
1208 optical lens
1212 pixel sensor
1214 timing generator
1216 flash
1218 A/D converter circuit
1220 buffer memory
1222 digital processor
1224 firmware memory
1226 clock
1228 RAM memory
1230 color display
1232 audio codec
1234 microphone
1236 speaker
1238 mobile phone network
1240 wireless modem
1242 RF channel
1244 photo service provider
1246 Internet
1248 user controls
1250 dock
1252 dock interface

The invention claimed is:

1. An image sensor comprising:
(a) a substrate having a plurality of photosensitive areas arranged in a two-dimensional array;
(b) a light shield spanning the photosensitive areas and configured to produce a plurality of apertures, wherein the plurality of apertures are positioned over respective photosensitive areas, wherein the plurality of apertures are arranged in the two-dimensional array; and
(c) a plurality of microlenses are positioned over respective photosensitive areas and are arranged in the two-dimensional array for focusing light through respective apertures, wherein the plurality of microlenses are respectively positioned spanning and centered over the respective photosensitive areas, wherein each microlens produces a single focal point, wherein a curvature of each microlens is shaped such that the single focal point of light through each microlens is substantially extended into the substrate to a point where light received at a normal incident angle fills each aperture and a portion of the light received at the normal incident angle is blocked by the light shield, and wherein, as an incident light angle of the light increases, an amount of light blocked at one edge of the light shield is offset by an increase in the light received at an opposite edge of the light shield.

2. The image sensor as in claim 1, wherein the image sensor is either a full-frame charge-coupled device or a frame transfer charge-coupled device.

3. An image sensor comprising:
(a) a substrate having a plurality of photosensitive areas arranged in a two-dimensional array;
(b) a first optical material having a first optical transmission characteristic disposed over a first portion of a photosensitive area and a second optical material having a second optical transmission characteristic disposed over a second portion of a photosensitive area;
(c) a light shield spanning the photosensitive areas and configured to produce a plurality of apertures, wherein the plurality of apertures are positioned over respective photosensitive areas, wherein the plurality of apertures are arranged in the two-dimensional array and the light shield blocks or substantially blocks light impinging the second optical material; and
(d) a plurality of microlenses are positioned over respective photosensitive areas and are arranged in the two-dimensional array for focusing light through respective apertures, wherein the plurality of microlens are respectively positioned spanning and centered over the respective photosensitive areas, wherein each microlens produces a single focal point, wherein a curvature of each microlens is shaped such that the single focal point of light through each microlens is substantially extended into the substrate to a point where light received at a normal incident angle fills each aperture and a portion of the light received at the normal incident angle is blocked by the light shield, and wherein, as an incident light angle of the light increases, an amount of light blocked at one edge of the light shield is offset by an increase in the light received at an opposite edge of the light shield.

4. The image sensor as in claim 3, wherein the first optical material is more transmissive to light than the second optical material.

5. The image sensor as in claim 3, wherein the light shield also spans a portion of the first optical material.

6. The image sensor as in claim 3, wherein the light shield completely spans the second optical material.

7. The image sensor as in claim 3, wherein the image sensor is either full-frame charge-coupled device or a frame transfer charge-coupled device.

8. A camera comprising:
(a) an optical lens that may be shifted and tilted relative to the image sensor;
(b) an image sensor comprising:
(i) a substrate having a plurality of photosensitive areas arranged in a two-dimensional array;
(ii) a light shield spanning the photosensitive areas and configured to produce a plurality of apertures, wherein the plurality of apertures are positioned over respective photosensitive areas and are arranged in the two-dimensional array; and
(iii) a plurality of microlenses are positioned over respective photosensitive areas and are arranged in the two-dimensional array for focusing light through respective apertures, wherein the plurality of microlenses are respectively positioned spanning and centered over the respective photosensitive areas, wherein each microlens produces a single focal point, wherein a curvature of each microlens is shaped such that the single focal point of light through each microlens is substantially extended into the substrate to a point where light received at a normal incident angle fills each aperture and a portion of the light received at the normal incident angle is blocked by the light shield, and wherein, as an incident light angle of the light increases, an amount of light blocked at one edge of the light shield is offset by an increase in the light received at an opposite edge of the light shield.

9. The camera as in claim 8, wherein the image sensor is either a full-frame charge-coupled device or a frame transfer charge-coupled device.

10. A camera comprising:
(a) an optical lens that may be shifted and tilted relative to the image sensor;
(b) an image sensor comprising:
(i) a substrate having a plurality of photosensitive areas arranged in a two-dimensional array;
(ii) a first optical material having a first optical transmission characteristic disposed over a first portion of a photosensitive area and a second optical material having a second optical transmission characteristic disposed over a second portion of a photosensitive area;
(iii) a light shield spanning the photosensitive areas and configured to produce a plurality of apertures, wherein the plurality of apertures are positioned over respective photosensitive areas, wherein the plurality of apertures are arranged in the two-dimensional array and the light shield blocks or substantially blocks light impinging the second optical material; and
(iv) a plurality of microlenses are positioned over respective photosensitive areas and are arranged in the two-dimensional array for focusing light through respective apertures, wherein the plurality of microlens are respectively positioned spanning and centered over the respective photosensitive areas, wherein each microlens produces a single focal point, wherein a curvature of each microlens is shaped such that the single focal point of light through each microlens is substantially extended into the substrate to a point where light received at a normal incident angle fills each aperture and a portion of the light received at the normal incident light is blocked by the light shield, and wherein, as an incident light angle of the light increases, an amount of light blocked at one edge of the light shield is offset by an increase in the light received at an opposite edge of the light shield.

11. The camera as in claim 10, wherein the first optical material is more transmissive to light than the second optical material.

12. The camera as in claim 10, wherein the light shield also spans a portion of the first optical material.

13. The camera as in claim 10, wherein the light shield completely spans the second optical material.

14. The camera as in claim 10, wherein the image sensor is either full-frame charge-coupled device or a frame transfer charge-coupled device.

* * * * *